United States Patent [19]

Osterwalder

[11] Patent Number: 4,464,624

[45] Date of Patent: Aug. 7, 1984

[54] BROADBAND OPTICAL SPECTRUM ANALYZER

[75] Inventor: Johann M. Osterwalder, Encinitas, Calif.

[73] Assignee: General Dynamics/Electronics Division, San Diego, Calif.

[21] Appl. No.: 311,787

[22] Filed: Oct. 15, 1981

[51] Int. Cl.³ ............................................ G01R 23/16
[52] U.S. Cl. ................................................ 324/77 K
[58] Field of Search .................. 324/77 K; 343/55 A; 350/162

[56] References Cited

U.S. PATENT DOCUMENTS 3,984,802  10/1976  Lippel, Jr. .................... 324/77 K
3,988,671  10/1976  Pedinoff ....................... 324/77 K
4,253,060   2/1981  Chen ............................ 324/77 K Primary Examiner—Michael J. Tokar
Attorney, Agent, or Firm—Brown & Martin

[57] ABSTRACT

A broadband optical spectrum analyzer analyzes RF frequencies by modulating a laser beam at its source with the RF frequencies. The modulated laser beam is collimated and directed to a reflection means where signal components of different frequencies are reflected at different angles. Rays of the same spectral range are collected and interpreted.

4 Claims, 2 Drawing Figures

BROADBAND OPTICAL SPECTRUM ANALYZER

The present invention relates to a device for analyzing RF frequencies and in particular to a device wherein a laser beam is modulated by these RF frequencies.

BACKGROUND OF THE INVENTION

There are many situations wherein various possible sources of radiation exist in an area and these sources vary widely in frequency. Such situations usually require that a particular source of radiation be identified very quickly. A typical example involves a fighter plane. There are usually many possible radiation sources in the area where the pilot is flying. He must be able to quickly detect and recognize the radiation sources he is interested in such as a target. The pilot's equipment must have the capability of examining a large band width in a small amount of time and determine in a fraction of a second what it sees.

Broadband optical equipment is particularly well adapted to this situation. An infrared laser beam can be used effectively to detect radiation sources. However, a typical application of laser beams for this purpose utilizes an acousto-optic modulator to modulate the laser beam with an RF signal. The acousto-optic modulator is limited in band width and thus limits the use of the optical spectrum analyzer.

SUMMARY OF THE INVENTION

Therefore, it is an object of the present invention to provide a new and improved broadband optical spectrum analyzer which significantly increases the band width that can be used.

It is another object of the present invention to provide such a new and improved broadband optical spectrum analyzer which accomplishes the increase in band width while reducing the complexity, cost and size of the optical signal processor.

Other objects of the invention will become apparent from the following description wherein reference is made to the accompanying drawings.

An exemplary embodiment of the present invention which accomplishes the above objects and overcomes the problems of the prior art involves means for generating a laser beam and means for modulating the laser beam at its source with an RF signal to be analyzed. Means is provided for collimating the modulated laser beam and directing it to a grating or reflection means where signal components of the beam are reflected at different angles depending upon their frequency. A transforming lens focuses the rays of the same spectral range to a single point on a photodiode array and the data from the photodiode array is converted and interpreted in parallel post processing means for analyzing the RF signal.

DETAILED DESCRIPTION OF THE INVENTION

Figure 1:
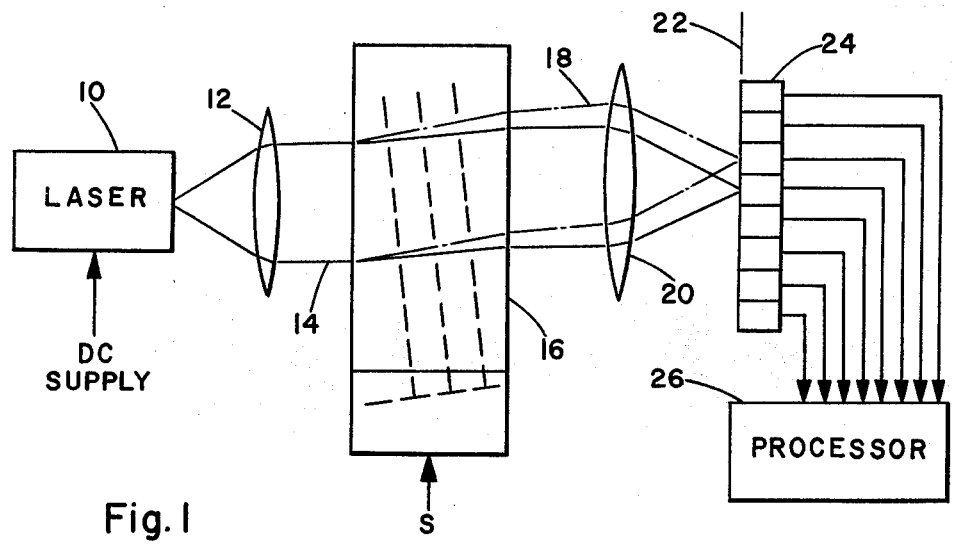
FIG. 1 is a schematic diagram depicting a conventional optical spectrum analyzing device.

A conventional optical signal processor is shown in FIG. 1 of the drawings. A coherent laser source 10 such as an injection laser provides a source of infrared radiation. The laser beam is collimated by collimating lens 12 and the collimated beam 14 is fed into and illuminates an acousto-optical modulator 16. The RF signal S to be analyzed is introduced into the acousto-optical modulator and modulates the laser beam 14. The proper Bragg angle must be maintained between the infrared and the sound wave propagation directions. The optical beam 18 leaving the acousto-optical modulator is transformed by a transforming lens 20 resulting in a specific infrared distribution in the bank focal plane 22 of the lens. The net effect is a spatial distribution of the infrared output which corresponds to the different frequency components of the RF signal being analyzed. The individual frequency components are detected by a photodiode array 24 and the output from the photodiode array is passed to a parallel post processor 26 to provide an indication of the frequency content of the RF signal being analyzed.

The limiting function of this conventional optical signal analyzer is the band width of the acousto-optical modulator. Typical numbers achievable today are 400 megahertz with a modulator center frequency of 600 megahertz.

Figure 2:
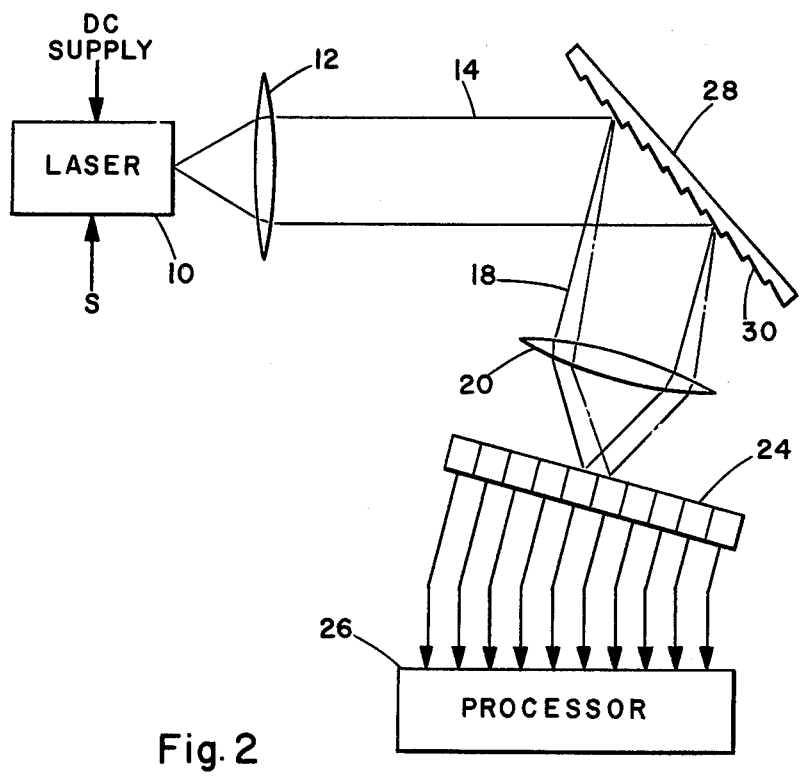
FIG. 2 is a schematic diagram demonstrating the broadband optical spectrum analyzer of the present invention.

The broadband optical signal processor of the present invention is demonstrated in FIG. 2 of the drawings. This construction completely eliminates the need of the band width limiting acousto-optical modulator. The RF signal S to be processed with band width delta B is introduced into the laser cavity of the injection laser 10 either by internal or external modulation techniques which are well known in the art. These techniques result in modulation of an injection laser infrared carrier in a range from d.c. to beyond ten gigahertz.

The modulated laser output signal is collimated by collimating lens 12 resulting in signals 14 which are passed to a grating 28. The grating includes a reflective surface separated into segments 30 which reflect the infrared components of different wave length at different angles. The reflected infrared rays 18 pass through a transforming lens 20 which focuses the infrared rays of the same spectral range into a single point. The intensity of the individual infrared spots is sensed by the diodes in a diode array 24 and the data is passed to a parallel post processor 26 where an indication of the frequency content of the RF signal being analyzed is presented. Each diode output corresponds to a particular spectrum component of the input RF signal band delta B.

The optical spectrum analyzer of the present invention provides a band width improvement which is at least ten times greater than the conventional optical spectrum analyzer. The complexity, cost and size of the conventional optical signal processor are reduced considerably with the construction of the present invention.

Having thus described my invention, I claim:

1. A broadband optical spectrum analyzer for analyzing an RF signal, comprising:
    injection laser means for generating a laser signal including a laser cavity;
    means for modulating said laser signal by introducing the RF signal to be analyzed into said laser cavity;
    means for collimating said modulated laser signal;

reflecting means for reflecting said collimated laser signal with said laser signal components being reflected at different angles depending upon frequency content;

a photodiode array;

a transforming lens for focusing the laser rays of the same spectral range from said laser signal to a single point on said photodiode array, each diode output corresponding to a particular spectrum component of the RF signal being analyzed; and parallel post processing means for analyzing the RF signal.

2. A broadband optical spectrum analyzer according to claim 1 wherein the laser signal is an infrared beam.

3. The method of analyzing the spectrum of a broadband RF signal with a bandwidth varying from d.c. to beyond ten gigahertz, comprising the steps of:

generating a laser beam in a cavity injection type generating device;

introducing an RF signal to be analyzed into the cavity of said laser beam generating device for modulating said laser beam;

collimating said laser beam:

reflecting the various frequency components of said modulated laser beam at different angles;

receiving said frequency components and converting the rays of the same spectral range to a point; and sensing the position and intensity of said rays.

4. The method of analyzing the spectrum of a broadband RF signal according to claim 3 using an infrared laser beam.

* * * * *